United States Patent [19]

Weaver et al.

[11] Patent Number: 4,736,169
[45] Date of Patent: Apr. 5, 1988

[54] VOLTAGE CONTROLLED OSCILLATOR WITH FREQUENCY SENSITIVITY CONTROL

[75] Inventors: Gary R. Weaver, Manhattan Beach; Dana H. Theis, Long Beach; Bernard L. Walsh, Jr., Northridge; Bryce M. Smith, Los Angeles, all of Calif.

[73] Assignee: Hughes Aircraft Company, Los Angeles, Calif.

[21] Appl. No.: 912,704

[22] Filed: Sep. 29, 1986

[51] Int. Cl.$^4$ .......................... H03B 5/18; H03C 3/22
[52] U.S. Cl. .................... 331/117 R; 331/117 D; 331/117 V; 332/30 V
[58] Field of Search .......... 331/36 C, 117 R, 117 FE, 331/177 V, 117 D; 332/30 V, 18

[56] References Cited

U.S. PATENT DOCUMENTS

| | | | |
|---|---|---|---|
| 4,009,448 | 2/1977 | Hopwood et al. | 331/4 |
| 4,288,875 | 9/1981 | Carter | 455/197 |
| 4,310,809 | 1/1982 | Buck et al. | 331/177 V X |
| 4,392,113 | 7/1983 | Jackson | 331/14 |
| 4,462,110 | 7/1984 | Baldwin et al. | 377/43 |

OTHER PUBLICATIONS

Niehenke et al, "A Microstrip Low-Noise X-Band Voltage-Controlled Oscillator", IEEE Trans. Microwave Theory and Techniques, vol. MTT-27, No. 12, Dec. 1979.

Ku-Band Digitally Tuned Oscillator will soon be available for Systems Designers, C. Pham, J. Lee, D. Kumamoto, Defence Electronics, Feb. 1982, pp. 46-53.

Primary Examiner—Siegfried H. Grimm
Attorney, Agent, or Firm—S. M. Mitchell; M. J. Meltzer; A. W. Karambelas

[57] ABSTRACT

A voltage controlled oscillator is tuned with a network comprising two varactor diodes and two transmission lines. By selecting appropriate values of varactor capacitance and transmission line length and width the overall reactance of the network is such that, when a varactor tuning voltage is varied, the output frequency of the voltage controlled oscillator will vary in an fashion with respect to the tuning voltage. Such a voltage controlled oscillator is gain compensated and exhibits a controlled modulation sensitivity over a range of frequencies. If the required frequency range of the oscillator is known beforehand, an alternate embodiment of the invention may be employed in which one of the varactor diodes is replaced with a fixed capacitor having a suitable value for the desired frequency range.

6 Claims, 2 Drawing Sheets

VOLTAGE CONTROLLED OSCILLATOR WITH FREQUENCY SENSITIVITY CONTROL

BACKGROUND

This invention relates to voltage controlled oscillators and, more particularly, to a gain compensated varactor tuning network for a voltage controlled oscillator.

Voltage controlled oscillators (VCO's) are oscillators which have a frequency output which may be varied in response to an applied voltage signal. VCO's are typically employed as a component within a phase-locked loop (PLL) circuit. A PLL is typically utilized when it is desired to synchronize two signals in both phase and frequency. As an example, one signal may be a local oscillator within a communications device, while the second signal may be a received frequency.

A phase-locked loop may be characterized as a closed-loop electronic servomechanism the output of which locks onto and tracks a reference signal. Phase lock is achieved by comparing the phase of the PLL output signal to the phase of the reference signal. Any phase difference between the two signals is converted to a correction voltage, typically by a phase detector circuit. This correction voltage is applied to the VCO circuit, thereby adjusting its output frequency such that it tracks the reference frequency.

As may be appreciated, the response time of the VCO circuit to a change in the applied correction voltage is an important parameter of such a circuit, especially if the reference frequency is varying rapidly. As may be further appreciated, the control of the VCO's tuning characteristic, that is the ability of the VCO output frequency to vary in a controlled and predictable fashion with respect to a change in the correction voltage, is also an important consideration.

Achieving a specific VCO voltage-to-frequency relationship is especially difficult when the VCO uses one or more varactor diode components as frequency tuning elements. Varactor diodes are essentially two terminal semiconductor diodes wherein the inherent p-n junction capacitance is emphasized. By varying a reverse bias applied to such a varactor diode, the junction capacitance may be varied, thus making the device equivalent to a voltage controlled capacitor. By their inherent nature however, varactor diodes have an undesireable nonlinear voltage-to-capacitance relationship, that is, the capacitance varies in a nonlinear fashion with respect to the applied reverse bias voltage. Furthermore, the particular nonlinear characteristic of a varactor diode is dependent, typically, on certain specific physical characteristics of the diode. When such a varactor diode is utilized as a tuning component in a VCO, the resulting output frequency of the VCO likewise exhibits an undesireable voltage-to-frequency relationship, the frequency being dependent on the capacitance of the varactor diode. In response to the problem created by this inherent voltage-to-capacitance relationship of a varactor diode, it has been known in the prior art to utilize various linearization techniques to compensate for the undesireable nonlinearity characteristics of the varactor diode.

One such technique employs a high speed linearizing driver circuit to provide a linearized correction voltage to the VCO. Such a driver circuit is typically comprised of a high slew-rate operational amplifier combined with a breakpoint generator, the generator acting to change the gain of the amplifier at preset "breakpoints" as the input correction voltage varies. The resulting output signal is thereby composed of a number of linear segments, the number of such segments increasing with an increasing number of breakpoints of the generator. The output linearized correction voltage is thus made to vary in a nonlinear fashion with respect to the applied correction voltage. The response time of the circuit with respect to a change in the applied correction voltage is typically in the range of 50 to 500 nanoseconds. The effect of the linearized correction voltage is to compensate for the nonlinear voltage-to-capacitance characteristic of the varactor tuning components, thereby providing a VCO having an output frequency which varies in a more linear fashion with respect to the correction voltage.

A disadvantage of such a linearing circuit is that, in order to achieve a minimum response time to a change in the correction signal, a high-slew rate and, hence, expensive operational amplifier is required. Another disadvantage of such a circuit is that the power consumed by components of the breakpoint generator, such components typically being transistors and resistors, varies with respect to the operating frequency. Hence, the thermal time constants and thermal stability of these components are critical factors which affect the short term frequency stability of the VCO.

While the linearizing circuit as described above is adapted for use with an input analog correction voltage, it may also be utilized in a PLL which employs digital components within the feedback loop between the VCO output and the phase detector. Typically, a digital counter is utilized to divide the output frequency of the VCO. The outputs of the digital counter are applied as inputs to a digital to analog converter (DAC), whereby an analog correction voltage is produced for application to the breakpoint amplifier of the linearizing circuit. As may be appreciated, the signal delay incurred by the operation of the DAC is additive to that of the linearizer, with the resulting overall response time of the DAC linearizer combination being in the range of approximately 500 to 2000 nanoseconds.

Because of the aforementioned problems of high cost and sensitivity to thermal effects associated with the breakpoint type of linearizer, it has been known in the art to replace the breakpoint linearizer with a digital look-up table, the look-up table being disposed between the output of the counter and the input to the DAC. The look-up table is contained typically within a high speed programmable read only memory (PROM). The PROM is configured such that its address inputs are connected to the outputs of the counter. The data outputs of the PROM are connected correspondingly to the digital inputs of the DAC. In operation, the outputs of the counter address a word of data within the PROM, the PROM thereafter outputting on its data lines the data so addressed. The value of each word of data contained within the PROM is determined by a calibration procedure performed when the PLL is first constructed. During the calibration procedure, the counter is driven such that it will output all possible combinations of PROM addresses. For each such address a corresponding PROM output is determined which, when applied to the DAC, produces an analog correction voltage which provides a linear VCO voltage-to-frequency transfer function. The digital value so determined is stored in the PROM at the addressed word. Thus, it can be seen that the aforementioned analog breakpoint linearizer is replaced with a digital look-up table contained within the PROM, the PROM providing a number of equivalent breakpoints that correspond to the number of words within the PROM. For example, if the PROM has 12 address inputs, the VCO will be linearized at the equivalent of 2,048 breakpoints.

While the aforementioned prior art table look-up scheme is suitable for modifying the voltage-to-frequency characteristics of a VCO utilizing varactor diode tuning elements, it is also disadvantageous for several reasons.

One problem created by the table look-up approach is that an additional response delay is introduced by the data access time of the PROM. This delay is additive to the delay of the DAC and results in a minimum response time delay of approximately 1000 nanoseconds.

Another problem created by this approach is that in each PLL system incorporating such a table look-up PROM, the system must be individually calibrated and the PROM custom programmed in order to compensate for the intrinsic characteristics of the VCO components, especially the nonlinearity characteristics of the varactor devices incorporated therein. This requirement for individualized system calibration is time consuming and costly, especially in relatively high production environments. An additional problem created by this approach is that if a system component is required to be changed at a later time, such as during field use, it may be necessary to recalibrate the system and program a new PROM in order to compensate for the different characteristics of the new component introduced into the system.

SUMMARY OF THE INVENTION

The foregoing problems are overcome and other advantages are realized by a voltage controlled oscillator circuit and a method for adjusting parameters thereof to achieve a controllable modulation sensitivity by the use of both coarse and fine tuning means, at least one of which is electronically variable. In one embodiment of the invention the coarse and the fine tuning means are serially coupled together, the fine tuning means being further coupled to an active oscillatory element. The fine tuning means is comprised of a length of transmission line and a varactor, the varactor being coupled to a source of fine tuning voltage which is adjusted to select the varactor capacitance. The coarse tuning means is similarly comprised of a second length of transmission line and a second varactor, the second varactor being coupled to a source of coarse tuning voltage which is adjusted to select the varactor capacitance. The length of each transmission line is preset to a length such that each transmission line exhibits an impedance which, in combination with the controlled capacitance of the corresponding varactor, yields a VCO which has an output frequency which varies in a desired and controlled nonlinear or linear fashion with respect to the applied tuning voltage. In an alternative embodiment of the invention the fine tuning voltage is fixed, thereby fixing the capacitance of the fine tuning varactor. The resultant VCO circuit is tuned by varying the coarse tuning voltage. In a further embodiment of the invention the fine tuning varactor is replaced with a fixed capacitor, the resultant VCO circuit being similarly tuned by varying the coarse tuning voltage.

When utilized as a component within a phase locked loop circuit, such a voltage controlled oscillator provides for a fast response, minimum complexity, linear output phase locked loop without the disadvantges of the prior art linearization methods employing expensive components or individualized calibration procedures.

BRIEF DESCRIPTION OF THE DRAWINGS

The foregoing features and other aspects of the invention are explained in the following description taken in connection with the accompanying drawings wherein.

DETAILED DESCRIPTION

Figure 1:
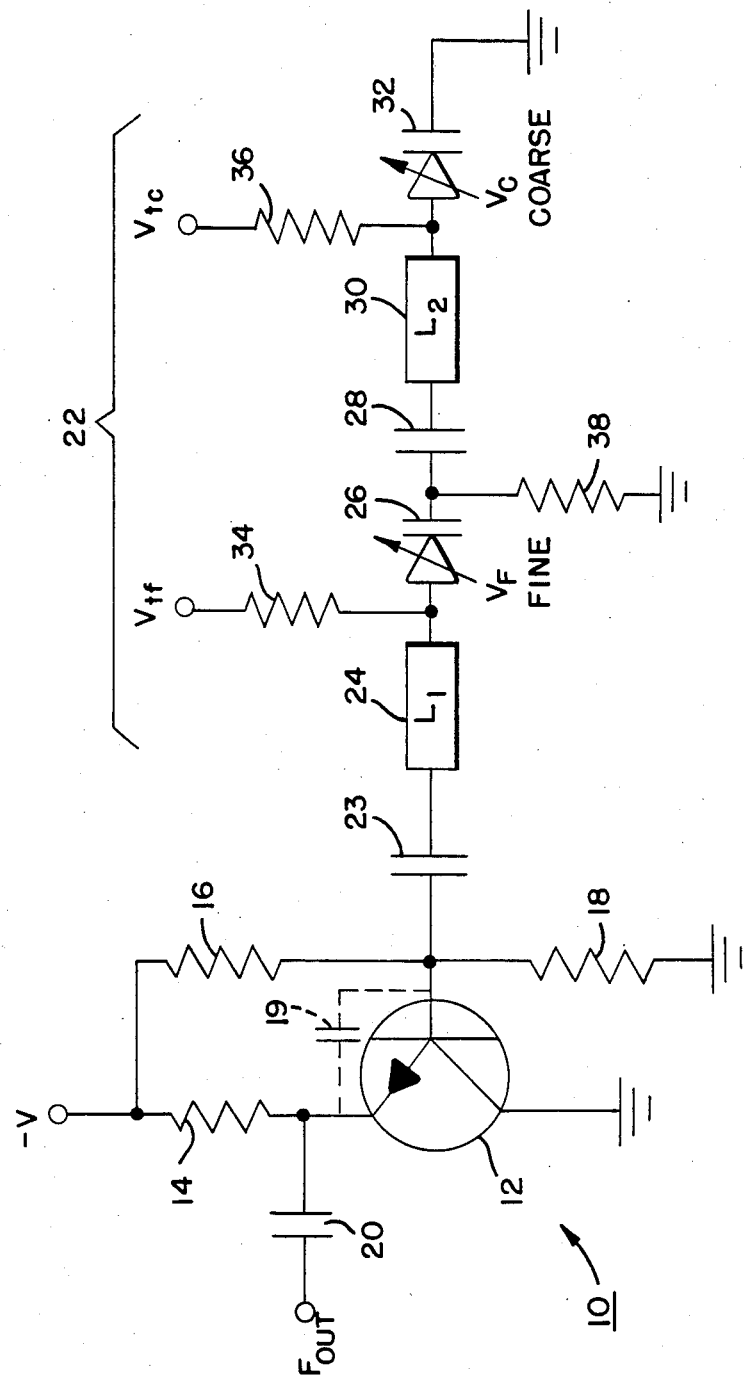
FIG. 1 is a schematic diagram showing a voltage controlled oscillator (VCO) having a tuning network constructed in accordance with one embodiment of the invention.

With reference to FIG. 1 there is shown an exemplary voltage controlled oscillator 10 constructed in accordance with an embodiment of the invention. Oscillator 10 comprises transistor 12 and bias setting resistors 14, 16 and 18. Transistor 12 is shown as an NPN type having a collector connected to circuit ground and an emitter connected to a source of negative voltage $-V$ through emitter resistor 14. The base of transistor 12 is biased through the voltage divider comprising resistors 16 and 18 such that transistor 12 may function as an oscillator. Regenerative feedback to sustain the oscillation of transistor 12 is provided by the intrinsic parasitic capacitance 19 present within transistor 12. The regenerative feedback provided in this manner results in a frequency of oscillation in the range of one to ten gigahertz if a bipolar device is utilized for transistor 12. If a field effect transistor (FET) device is utilized, the frequency of oscillation will be consequently higher. The frequency output of transistor 12 is coupled from the emitter through a capacitor 20 to a load (not shown).

In order to control the self-oscillatory mode of transistor 12 so that the device may be utilized as a voltage controlled oscillator (VCO), a frequency determining impedance network 22 is coupled to the base of transistor 12 through a DC blocking capacitor 23. The capacitance of capacitor 23 is chosen to be of a sufficient magnitude such that the reactance of capacitor 23 is negligible at the frequency of operation, resulting in capacitor 23 appearing essentially as a short circuit at the frequency of operation.

The frequency determining impedance network 22 comprises a fine-tuning diode device in the form of a varactor 26, a coarse-tuning diode device in the form of a varactor 32, a fine tuning high impedance transmission line 24 and a coarse-tuning high impedance transmission line 30. A fine-tuning voltage $V_{tf}$ and a coarse-tuning voltage $V_{tc}$ are applied to varactors 26 and 32 through resistors 34 and 36, respectively, by conventional means (not shown). Resistors 34 and 36 preferably employ metal film type resistive elements, the reason being that metal film elements typically exhibit a small associated parasitic capacitance component. As shown in FIG. 1, varactors 26 and 32 are connected so that their respective anodes are coupled to the tuning voltages $V_{tf}$ and $V_{tc}$. The normal mode of operation for such a varactor diode device is that the device is operated in a reverse biased state, therefore the polarities of both $V_{tf}$ and $V_{tc}$ must be negative in the circuit as shown in FIG. 1. However, in an alternative embodiment of the invention (not shown) the varactor diodes may be connected with their cathodes coupled to the tuning voltage. If the varactors are so connected the polarity of the tuning voltage must be positive in order to properly reverse bias the varactors. Resistor 38, preferably a metal film type, provides a ground reference for varactor 26.

A second DC blocking capacitor 28 is connected between fine tuning varactor 26 and transmission line 30 to prevent the interference of coarse tuning voltage $V_{tc}$ with varactor 26. As was described above with reference to blocking capacitor 23, the capacitance of capacitor 28 is chosen such that it presents a negligible impedance at the desired frequency or range of frequencies of operation of VCO 10.

Transmission lines 24 and 30, when terminated as described herein, may be considered to introduce a phase shift or impedance shift, thereby transforming the reactances of their corresponding varactors 26 and 32. At microwave frequencies, the transmission lines 24 and 30 are constructed of well known wave-guide microstrip, stripline or coaxial components while, at lower frequencies, a well known ladder network of discreet inductors and capacitors may be employed. The amount of phase shift introduced by transmission lines 24 and 30 at microwave frequencies is a function of their lengths and widths. By adjusting the length of such a transmission line, the reflected impedance may also be adjusted. In operation, the capacitive reactance of the coarse tuning varactor 32 is transformed by line 30, thereby providing a new reactance. This new reactance is combined with the reactance of line 24 and varactor 26, thus providing an overall reactance. This overall reactance will approach zero ohms at the resonant frequency of the oscillator. The frequency of oscillation of transistor 12 can therefore be seen to be a function of the inherent parasitic capacitance 19 of transistor 12 and the overall reactance of the impedance network comprised of transmission lines 24 and 26 and varactors 26 and 32. As may be appreciated, if the capacitances of varactors 26 and 32 are electronically varied, as will occur if the tuning voltages $V_{tf}$ and $V_{tc}$ are varied, the overall reactance of the aforementioned impedance network will vary. Thus it may be seen that the frequency of oscillation of transistor 12 will also vary, resulting in transistor 12 acting as a voltage controlled oscillator.

Figure 2:
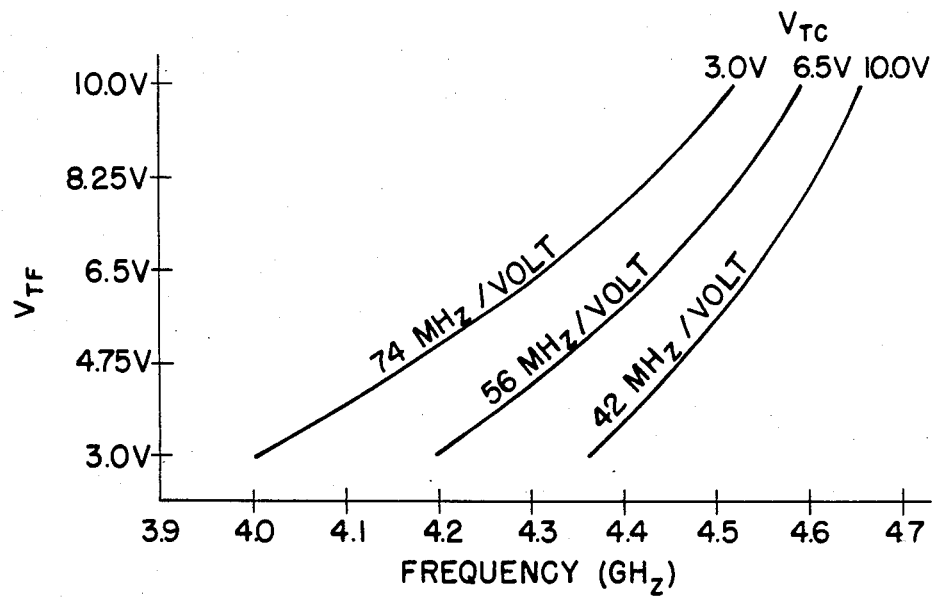
FIG. 2 is a graph showing the modulation sensitivity exhibited by the VCO of FIG. 1 wherein the turning network is constructed with components each having a given value.

In order to better appreciate the beneficial effects conferred by the invention upon the operation of a voltage controlled oscillator, it is advantageous to construct a graph which shows a series of modulation sensitivity, or tuning, curves. Referring to FIG. 2, one such graph is illustrated. The graph of FIG. 2 is constructed by setting the coarse tuning voltage $V_{tc}$ to a fixed value, thereby essentially setting the capacitance of varactor 32 to a fixed capacitance. The fine tuning voltage $V_{tf}$ is then varied and the resulting output frequency of the VCO 10 is measured for several different values of $V_{tf}$. As may be seen by an inspection of the graph of FIG. 2, as the coarse tuning voltage $V_{tc}$ is set at successively higher magnitudes, the rate of frequency change of the VCO 10 for a given range of $V_{tf}$ values is correspondingly less. This tuning characteristic is known as negative gain compensation, and is dependent upon the component values selected to construct the impedance network 22. As an example, the component values selected to yield the negatively compensated tuning curves of FIG. 2 are shown in TABLE 1 as follows:

TABLE 1

| # | DESCRIPTION | VALUE |
|---|---|---|
| 24 | Fine Tuning Line | Z = 120 ohms l = 211 degrees |
| 26 | Fine Tuning Varactor | C = 0.56–0.18 picofarads |
| 30 | Coarse Tuning Line | Z = 80 ohms l = 16 degrees |
| 32 | Coarse Tuning Varactor | C = 1.59–0.24 picofarads |

Figure 3:
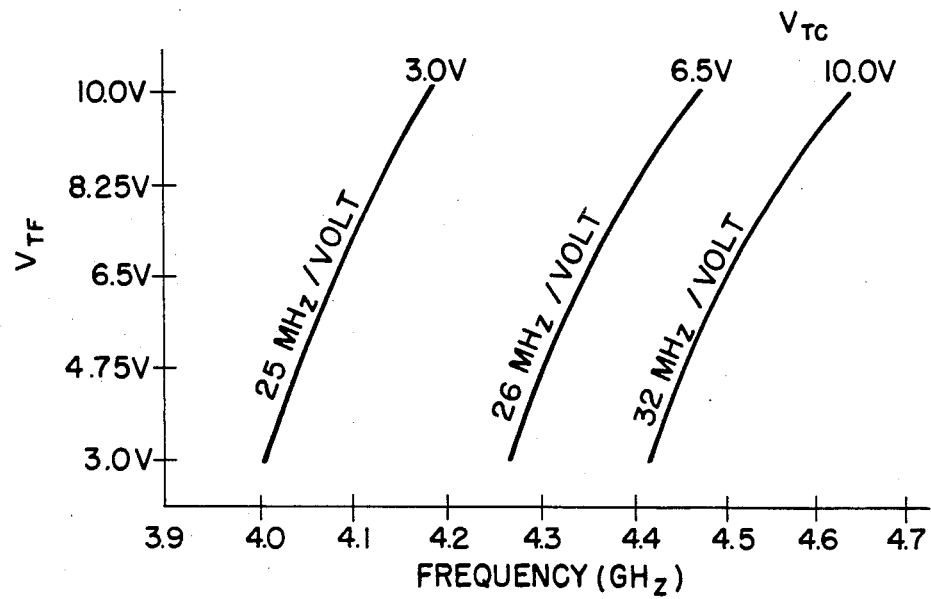
FIG. 3 is a graph showing the modulation sensitivity exhibited by the VCO of FIG. 1 wherein the tuning network is constructed with components each having another given value.

Referring now to FIG. 3, another graph of tuning curves is shown. The graph of FIG. 3 is constructed in a similar fashion to the graph of FIG. 2, that is, the magnitude of $V_{tc}$ is fixed while the magnitude of $V_{tf}$ is varied over a range of values. However, an inspection of FIG. 3 reveals that as the magnitude of $V_{tc}$ is set at successively higher magnitudes, the rate of frequency change of the VCO 10 for a given range of $V_{tf}$ values is correspondingly greater. This tuning characteristic is termed positive gain compensation, and is likewise dependent upon the particular values of the impedance network 22. In this example, the component values selected to yield the positively compensated tuning curves of FIG. 3 are shown in TABLE 2 as follows:

TABLE 2

| # | DESCRIPTION | VALUE |
|---|---|---|
| 24 | Fine Tuning Line | Z = 20 ohms l = 117 degrees |
| 26 | Fine Tuning Varactor | C = 15.9–2.15 picofarads |
| 30 | Coarse Tuning Line | Z = 80 ohms l = 79 degrees |
| 32 | Coarse Tuning Varactor | C = 0.38–0.17 picofarads |

An examination of the tuning curves of FIGS. 2 and 3 shows that the curves are of a varying slope exhibiting a lesser or a greater rate of change at a lower frequency. This nonlinearity results in what is known as frequency variable modulation sensitivity. This variable modulation sensitivity may have a detrimental effect on both the capture range and the noise features of a PLL circuit incorporating such a VCO if the amount of variable modulation sensitivity is unknown or uncontrolled. The aforementioned prior art tuning curve control techniques attempt to compensate for this variable modulation sensitivity by driving a tuning varactor with a nonlinear tuning voltage, creating, however, problems which have an adverse effect on either cost, complexity, or response time.

A varactor tuning network constructed in accordance with the invention does successively compensate for this nonlinearity by apportioning the components values of the transmission lines 24 and 30 and the varactors 26 and 32 such that the amount of modulation sensitivity may be accurately controlled. In other words, the lengths of transmission lines 24 and 30 and the capacitance values of varactors 26 and 32 are selected such that the resulting network 22 exhibits a controlled gain compensation curve that may fall between the curves shown in FIGS. 2 and 3. For example, the lengths of lines 24 and 30 may be adjusted such that the curves obtained are made essentially into straight line elements. The resulting network 22 exhibits therefore a constant value of modulation sensitivity over a desired range of frequencies. The specific component values utilized are of course dependent upon a variety of factors such as the range of frequencies over which the VCO will operate, the inherent circuit parasitic capacitances, and other application dependent factors. Referring once again to FIGS. 2 and 3 and TABLES 1 and 2 above, it can be seen that a specific combination of transmission line lengths and widths and varactor values may be chosen such that a variation in tuning voltage results in corresponding linear variation in VCO output frequency. Thus, the modulation sensitivity of the VCO 10 will remain constant over a desired range of frequencies, resulting in a VCO 10 which may be said to be gain compensated or gain linear.

In similar fashion, other component values may be chosen to provide a VCO having a controlled amount of positive or negative modulation sensitivity over a range of frequencies. Thus, the overall PLL response may be made linear, which is a desired result. The VCO may be required to be linear or nonlinear in order to compensate for other PLL characteristics.

Although the tuning network of the invention has been described as having two variable tuning voltages $V_{tc}$ and $V_{tf}$, it may be appreciated that if the desired range of frequencies over which operation is required is predetermined, the fine tuning voltage $V_{tf}$ may be fixed. The magnitude of $V_{tf}$, if fixed, is determined such that when $V_{tc}$ is varied, the output frequency of VCO 10 will correspondingly vary within the desired range of frequencies. As an example, and referring once again to FIG. 2, if it is desired to operate VCO 10 over a range of frequencies of 4.0 to 4.35 GHz, $V_{tf}$ could be fixed at a magnitude of 3.0 volts. If $V_{tc}$ is subsequently varied between 3.0 to 10.0 volts, the output of VCO 10 will vary within the desired range of frequencies.

Likewise, it may be appreciated that if the desired range of frequencies is predetermined as in the foregoing example, that $V_{tf}$ may be eliminated altogether and the varactor 26 replaced with a suitable fixed value of capacitance, one such value being 0.56 picofarads. Of course, if varactor 26 is replaced with a fixed capacitor the blocking capacitor 28 could be eliminated from the circuit of FIG. 1.

Thus it can be seen that both a novel tuning circuit for a VCO, and a method for tuning a VCO, has been described. The characteristics of the tuning circuit are well suited for use with a VCO that is a component of a PLL, although the tuning circuit of the invention is not limited to that application. Therefore it is to be understood that the above described embodiments of the invention are illustrative only and that modifications thereof may occur to those skilled in the art. Accordingly, this invention is not to be regarded as limited to the embodiments disclosed herein, but as to be limited only as defined by the appended claims.

What is claimed is:

1. A method of tuning a voltage controlled oscillator to provide a selectable modulation sensitivity, said oscillator comprising an active element with feedback and a tuning circuit connected to said active element for inducing oscillation, said method comprising the steps of:

selecting a first and a second transmission line and a first and a second voltage variable capacitor for said tuning circuit;

connecting one end of said first transmission line to said active element;

terminating a second end of said first transmission line, said step of terminating including a connecting of said first capacitor serially between the second end of said first transmission line and a first end of said second transmission line;

terminating said second transmission line by connecting said second capacitor to a second terminal of said second transmission line;

adjusting the length of said second transmission line to provide a reactance for interaction with a capacitive reactance of said second capacitor;

adjusting the length of said first transmission line to provide a reactance for interaction with a capacitive reactance of said first and said second capacitors; and electronically varying the capacity of one of said capacitors to select a frequency of said oscillation.

2. A tuning method according to claim 1 further comprising a step of electronically varying the capacity of the other of said capacitors to select a range of frequencies of said oscillation.

3. A tuning method according to claim 2 wherein each of said capacitors is a varactor, and each of said steps of electronically varying capacity is accomplished by applying a voltage to a varactor.

4. A tuning method according to claim 2 further wherein said step of electronically varying capacity to select a frequency is accomplished by varying the capacity of said second capacitor.

5. A tuning method according to claim 2 further wherein said step of electronically varying capacity to select a range of frequencies is accomplished by varying the capacity of said first capacitor.

6. A voltage controlled oscillator providing an output frequency having a controllable modulation sensitivity curve, said oscillator comprising;

an active element with feedback for inducing an oscillatory signal having said output frequency and a tuning circuit coupled to said active element for varying said output frequency, said tuning circuit including fine tuning means and coarse tuning means;

said fine tuning means being series connected between said coarse tuning means and said active element and comprising a first means, connected to said active element, for transforming a reactance, and a first capacitive means serially connected thereto, said first capacitive means being variable by an applied voltage; and said coarse tuning means being serially coupled to said fine tuning means and comprising a second means for transforming a reactance, and a second capacitive means, said second capacitive means being variable by an applied voltage.

* * * * *